(12) United States Patent
Rops et al.

(10) Patent No.: US 9,229,334 B2
(45) Date of Patent: Jan. 5, 2016

(54) LITHOGRAPHIC APPARATUS AND A DEVICE MANUFACTURING METHOD

(75) Inventors: Cornelius Maria Rops, Waalre (NL); Nicolaas Rudolf Kemper, Eindhoven (NL); Michel Riepen, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 436 days.

(21) Appl. No.: 12/961,586

(22) Filed: Dec. 7, 2010

(65) Prior Publication Data

US 2011/0134401 A1    Jun. 9, 2011

Related U.S. Application Data

(60) Provisional application No. 61/285,021, filed on Dec. 9, 2009, provisional application No. 61/313,964, filed on Mar. 15, 2010.

(51) Int. Cl.
*G03B 27/52* (2006.01)
*G03B 27/68* (2006.01)
*G03B 27/58* (2006.01)
*G03F 7/20* (2006.01)

(52) U.S. Cl.
CPC .................... *G03F 7/70341* (2013.01)

(58) Field of Classification Search
CPC .................................. G03F 7/70341
USPC ........................... 355/30, 52, 72, 73
See application file for complete search history.

(56) References Cited

U.S. PATENT DOCUMENTS

| | | | |
|---|---|---|---|
| 4,509,852 A | 4/1985 | Tabarelli et al. | |
| 5,900,354 A | 5/1999 | Batchelder | |
| 7,684,008 B2 | 3/2010 | De Smit et al. | |
| 7,903,232 B2 | 3/2011 | Leenders et al. | |
| 2002/0145711 A1* | 10/2002 | Magome et al. | 355/30 |
| 2004/0207824 A1 | 10/2004 | Lof et al. | |
| 2005/0024609 A1 | 2/2005 | De Smit et al. | |
| 2006/0038968 A1 | 2/2006 | Kemper et al. | |
| 2006/0050257 A1 | 3/2006 | Honda | |
| 2006/0158627 A1 | 7/2006 | Kemper et al. | |
| 2007/0085989 A1 | 4/2007 | Nagahashi et al. | |
| 2007/0243697 A1 | 10/2007 | Leenders et al. | |
| 2008/0212046 A1 | 9/2008 | Riepen et al. | |
| 2009/0122283 A1 | 5/2009 | Hasegawa | |

(Continued)

FOREIGN PATENT DOCUMENTS

| | | |
|---|---|---|
| EP | 1 420 298 | 5/2004 |
| JP | 2002-019099 | 1/2002 |

(Continued)

OTHER PUBLICATIONS

Machine translation of KR 10-2008-0075727.*

(Continued)

*Primary Examiner* — Deoram Persaud
(74) *Attorney, Agent, or Firm* — Pillsbury Winthrop Shaw Pittman LLP

(57) ABSTRACT

An immersion lithographic apparatus is disclosed that includes a fluid handling system configured to confine immersion liquid to a localized space between a final element of a projection system and a substrate and/or table and a gas supplying device configured to supply gas with a solubility in immersion liquid of greater than $5\times10^{-3}$ mol/kg at 20° C. and 1 atm total pressure to an area adjacent the space.

17 Claims, 5 Drawing Sheets

(56) References Cited

U.S. PATENT DOCUMENTS

| | | |
|---|---|---|
| 2009/0134488 A1 | 5/2009 | Jansen et al. |
| 2009/0161089 A1 | 6/2009 | Leenders et al. |
| 2009/0174871 A1 | 7/2009 | De Jong et al. |
| 2009/0213343 A1* | 8/2009 | Sewell et al. .......... 355/30 |
| 2009/0279060 A1 | 11/2009 | Direcks et al. |
| 2009/0279062 A1 | 11/2009 | Direcks et al. |
| 2012/0062860 A1 | 3/2012 | Chonan |
| 2012/0120376 A1 | 5/2012 | Bessems et al. |
| 2013/0155380 A1 | 6/2013 | Van Der Gaag et al. |

FOREIGN PATENT DOCUMENTS

| | | |
|---|---|---|
| JP | 2005-005713 | 1/2005 |
| JP | 2095-150290 | 6/2005 |
| JP | 2006-073906 | 3/2006 |
| JP | 2006-076130 | 3/2006 |
| JP | 2009-188383 | 8/2009 |
| KR | 2007-0047132 | 5/2007 |
| KR | 2008-0075727 | 8/2008 |
| TW | 200938958 | 9/2009 |
| TW | 200938960 | 9/2009 |
| WO | WO 99/49504 | 9/1999 |

OTHER PUBLICATIONS

Carroll et al. "The Solubility of Carbon Dioxide in Water at Low Pressure".*

Korean Office Action mailed Jan. 18, 2012 in corresponding Korean Patent Application No. 10-2010-0124701.

Japanese Office Action mailed Jun. 12, 2012 in corresponding Japanese Patent Application No. 2010-271352.

Taiwan Office Action dated Jun. 7, 2013 in corresponding Taiwan Patent Application No. 099142218.

Michel Riepen, U.S. Appl. No. 12/785,913, filed May 24, 2010.

* cited by examiner

LITHOGRAPHIC APPARATUS AND A DEVICE MANUFACTURING METHOD

This application claims priority and benefit under 35 U.S.C. §119(e) to U.S. Provisional Patent Application Ser. No. 61/285,021, entitled "A Lithographic Apparatus and A Device Manufacturing Method", filed on Dec. 9, 2009, and to U.S. Provisional Patent Application Ser. No. 61/313,964, entitled "A Lithographic Apparatus and A Device Manufacturing Method", filed on Mar. 15, 2010. The contents of those applications are incorporated herein in their entirety by reference.

FIELD

The present invention relates to a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

If the immersion liquid is confined by a fluid handling system to a localized area on the surface which is under the projection system, a meniscus extends between the fluid handling system and the surface. If the meniscus collides with a droplet on the surface, this may result in inclusion of a bubble in the immersion liquid. The droplet may be present on the surface for various reasons, including because of leaking from the fluid handling system. A bubble in immersion liquid can lead to imaging errors, for example by interfering with a projection beam during imaging of the substrate.

It is desirable, for example, to provide a lithographic apparatus in which the likelihood of bubble inclusion is at least reduced.

According to an aspect, there is provided an immersion lithographic apparatus comprising: a fluid handling system configured to confine immersion liquid to a localized space between a final element of a projection system and a substrate and/or table; and a gas supplying device configured to supply gas with a solubility in the immersion liquid of greater than $5 \times 10^{-3}$ mol/kg at 20° C. and 1 atm total pressure to a region adjacent the space.

According to an aspect, there is provided an immersion lithographic apparatus comprising: a fluid handling system configured to confine immersion liquid to a localized space between a final element of a projection system and a substrate and/or table; and a gas supplying device configured to supply gas with a diffusivity in the immersion liquid of greater than $3 \times 10^{-5}$ cm$^2$ s$^{-1}$ at 20° C. and 1 atm total pressure to a region adjacent the space.

According to an aspect, there is provided an immersion lithographic apparatus comprising: a fluid handling system configured to confine immersion liquid to a localized space between a final element of a projection system and a substrate and/or table; and a gas supplying device configured to supply gas with a product of diffusivity and solubility in the immersion liquid of greater than that of air at 20° C. and 1 atm total pressure to a region adjacent the space.

According to an aspect, there is provided a device manufacturing method, comprising projecting a patterned beam of radiation through an immersion liquid confined to a localized space between a final element of a projection system and a substrate; and providing to a region adjacent to the space a gas with a solubility in the immersion liquid of greater than $5 \times 10^{-3}$ mol/kg at 20° C. and 1 atm total pressure.

According to an aspect, there is provided a device manufacturing method, comprising: projecting a patterned beam of radiation through an immersion liquid confined to a localized space between a final element of a projection system and a substrate; and providing to a region adjacent to the space a gas with a diffusivity in the immersion liquid of greater than $3 \times 10^{-5}$ cm$^2$ s$^{-1}$ at 20° C. and 1 atm total pressure.

According to an aspect, there is provided a device manufacturing method, comprising: projecting a patterned beam of radiation through an immersion liquid confined to a localized space between a final element of a projection system and a substrate; and providing to a region adjacent to the space a gas with a product of diffusivity and solubility in the immersion liquid of greater than that of air at 20° C. and 1 atm total pressure.

According to an aspect, there is provided a fluid handling system for an immersion lithographic apparatus, the fluid handling system configured to confine immersion liquid to a localized space between a final element of a projection system and a substrate and/or table, and comprising a gas supplying device configured to supply gas with a solubility in the immersion liquid of greater than $5 \times 10^{-3}$ mol/kg at 20° C. and 1 atm total pressure to a region adjacent the space.

According to an aspect, there is provided a fluid handling system for an immersion lithographic apparatus, the fluid handling system configured to confine immersion liquid to a localized space between a final element of a projection system and a substrate and/or table; and comprising a gas supplying device configured to supply gas with a diffusivity in the immersion liquid of greater than $3 \times 10^{-5}$ cm$^2$ s$^{-1}$ at 20° C. and 1 atm total pressure to a region adjacent the space.

According to an aspect, there is provided a fluid handling system for an immersion lithographic apparatus, the fluid handling system configured to confine immersion liquid to a localized space between a final element of a projection system and a substrate and/or table; and comprising a gas supplying device configured to supply gas with a product of diffusivity and solubility in the immersion liquid of greater than that of air at 20° C. and 1 atm total pressure to a region adjacent the space.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
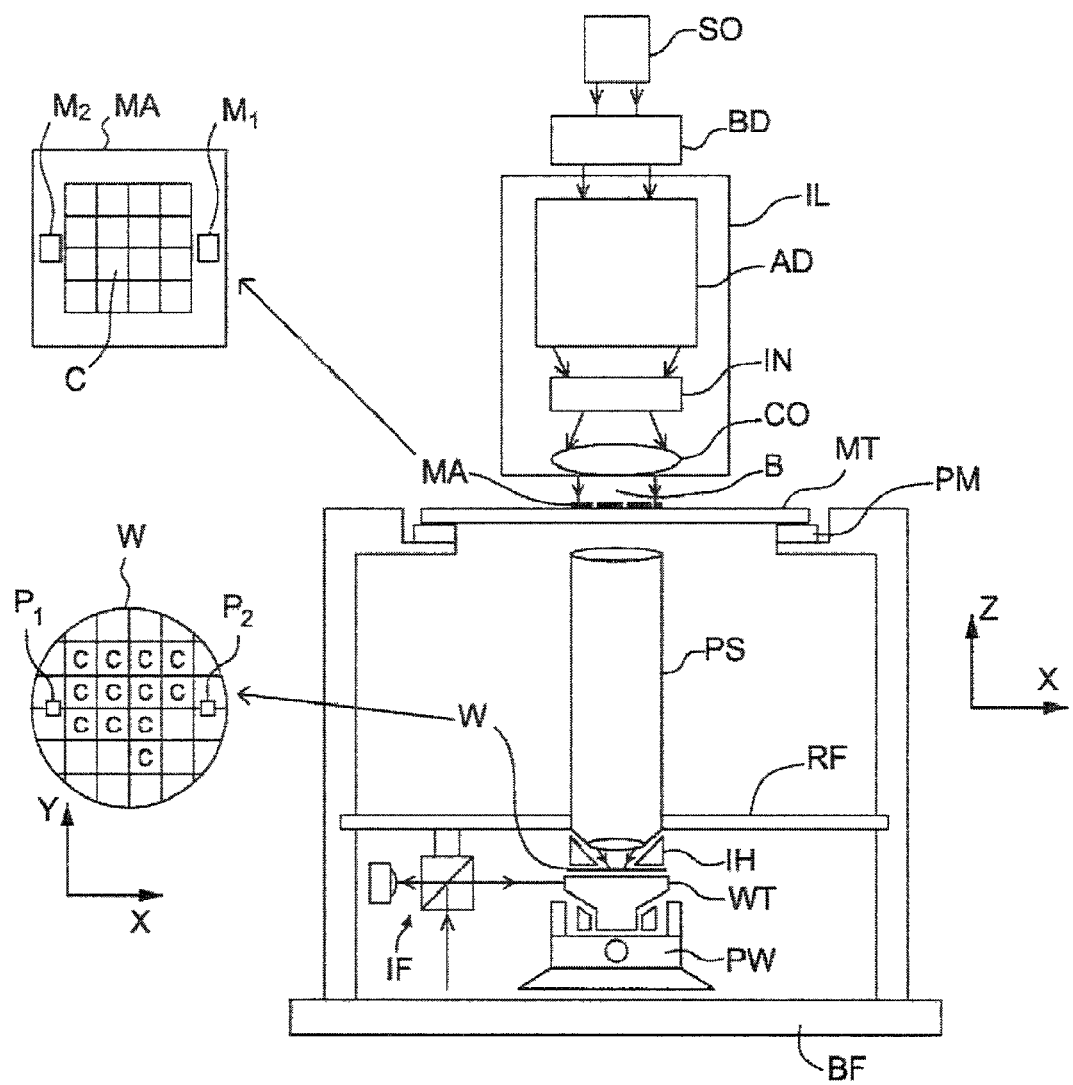
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and a projection system (e.g. a refractive projection lens system) PS, configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable minor arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions.

The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables, e.g., two or more substrate tables or a substrate table and a sensor table (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-7 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
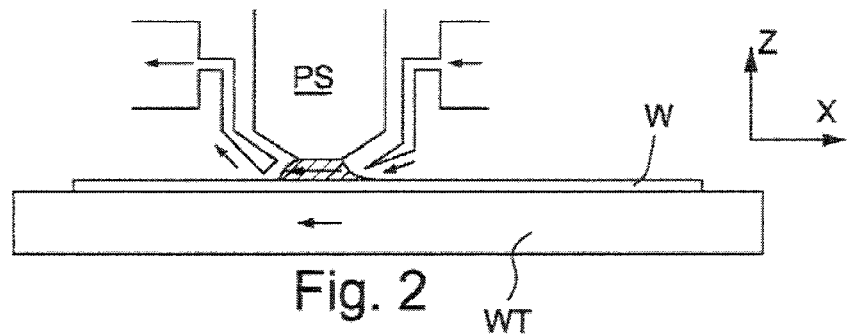
FIGS. 2 and 3 depict a liquid supply system for use in a lithographic projection apparatus.
Figure 3:
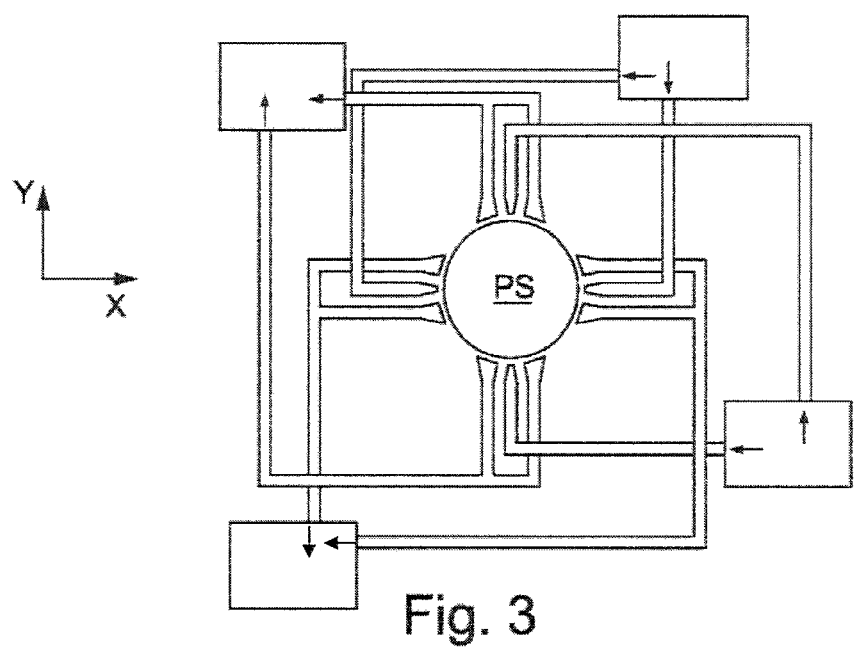

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
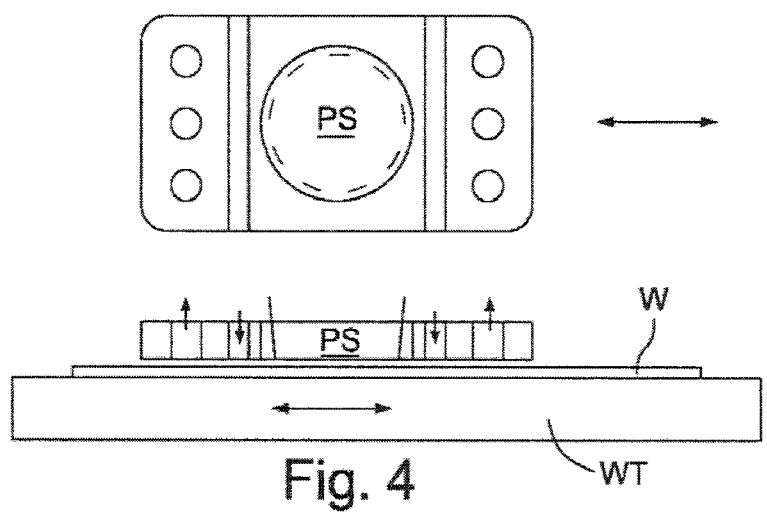
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

Figure 5:
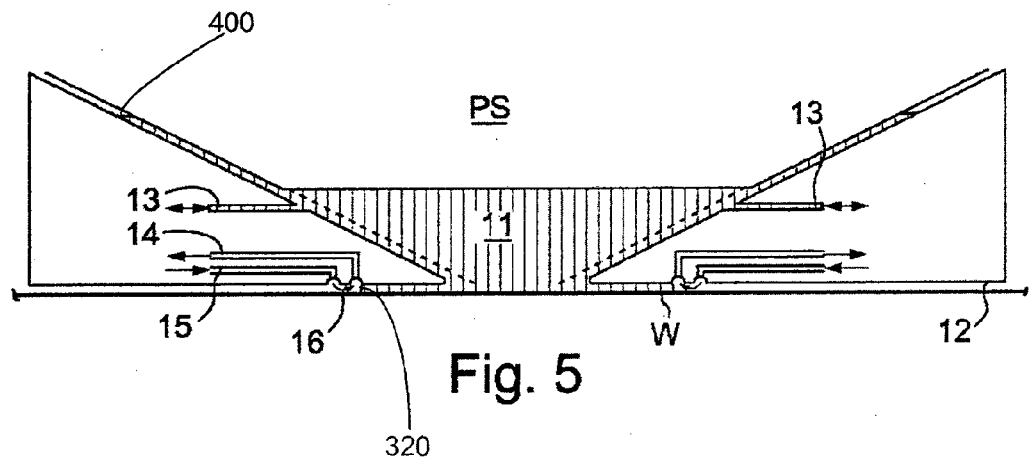
FIG. 5 depicts a further liquid supply system for use in a lithographic projection apparatus.

FIG. 5 schematically depicts a localized liquid supply system or fluid handling system with a liquid confinement structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The liquid confinement structure 12 is substantially stationary relative to the projection system in the XY plane though there may be some relative movement in the Z direction (in the direction of the optical axis). In an embodiment, a seal is formed between the liquid confinement structure 12 and the surface of the substrate W and may be a contactless seal such as a gas seal (such a system with a gas seal is disclosed in European patent application publication no. EP-A-1,420,298) or liquid seal.

The liquid confinement structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the liquid confinement structure 12 positioned below and surrounding the final element of the projection system PS. Liquid is brought into the space below the projection system PS and within the liquid confinement structure 12 by liquid inlet 13. The liquid may be removed by liquid outlet 13. The liquid confinement structure 12 may extend a little above the final element of the projection system. The liquid level rises above the final element so that a buffer of liquid is provided. In an embodiment, the liquid confinement structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the barrier member 12 and the surface of the substrate W. The gas seal is formed by gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In an embodiment, the liquid confinement structure 12 does not have a gas seal.

Figure 6:
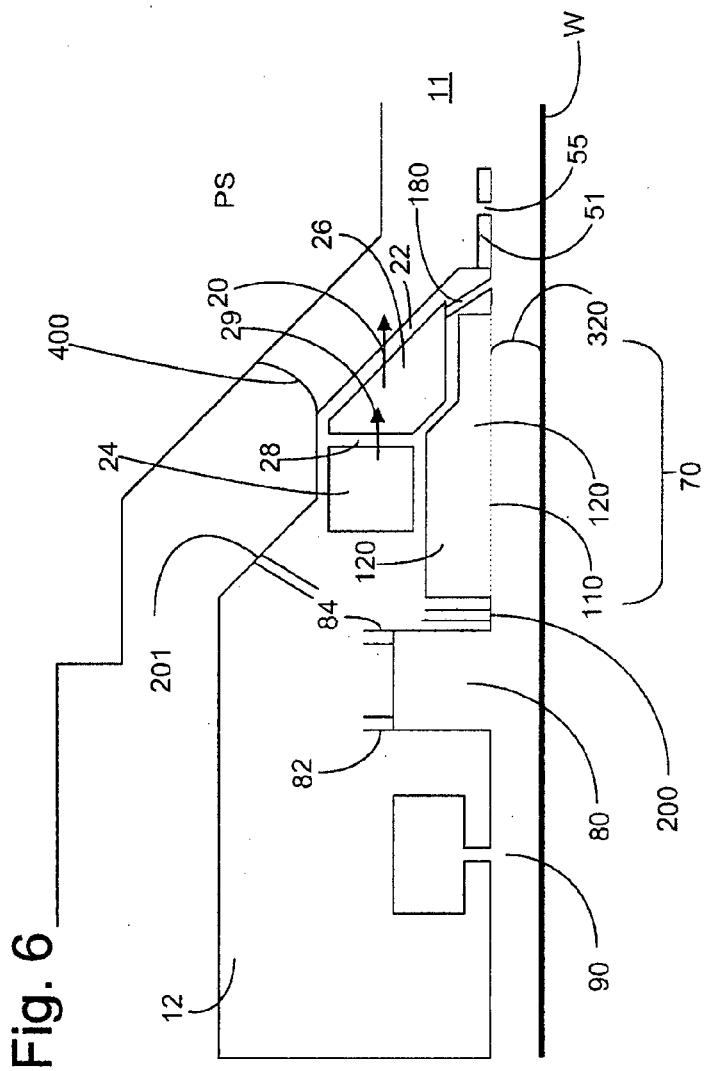
FIG. 6 depicts a further liquid supply system for use in a lithographic projection apparatus.

FIG. 6 illustrates a liquid confinement structure 12 which is part of a liquid supply system. The liquid confinement structure 12 extends around the periphery (e.g. circumference) of the final element of the projection system PS.

A plurality of openings 20 in the surface which in part defines the space 11 provide the liquid to the space 11. The liquid passes through openings 29, 20 in side walls 28, 22 respectively through respective chambers 24, 26 prior to entering the space 11.

A seal is provided between the bottom of the liquid confinement structure 12 and a facing surface, e.g. the substrate W, or a substrate table WT, or both. In FIG. 6 a seal device is configured to provide a contactless seal and is made up of several components. Radially outwardly from the optical axis of the projection system PS, there is provided a (optional) flow control plate 51 which extends into the space 11. The control plate 51 may have an opening 55 to permit flow liquid therethrough; the opening 55 may be beneficial if the control plate 51 is displaced in the Z direction (e.g., parallel to the optical axis of the projection system PS). Radially outwardly of the flow control plate 51 on the bottom surface of the liquid confinement structure 12 facing (e.g., opposite) the facing surface, e.g., the substrate W, may be an opening 180. The opening 180 can provide liquid in a direction towards the facing surface. During imaging this may be useful in preventing bubble formation in the immersion liquid by filling a gap between the substrate W and substrate table WT with liquid.

Radially outwardly of the opening 180 may be an extractor assembly 70 to extract liquid from between the liquid confinement structure 12 and the facing surface. The extractor assembly 70 may operate as a single phase or as a dual phase extractor.

Radially outwardly of the extractor assembly 70 may be a recess 80. The recess 80 is connected through an inlet 82 to the atmosphere. The recess 80 may be connected via an outlet 84 to a low pressure source. Radially outwardly of the recess 80 may be a gas knife 90. An arrangement of the extractor assembly, recess and gas knife is disclosed in detail in United States patent application publication no. US 2006/0158627 incorporated herein in its entirety by reference.

The extractor assembly 70 comprises a liquid removal device, extractor or inlet such as the one disclosed in United States patent application publication no. US 2006-0038968, incorporated herein in its entirety by reference. In an embodiment, the liquid removal device 70 comprises an inlet which is covered in a porous material 110 which is used to separate liquid from gas to enable single-liquid phase liquid extraction. An under pressure in chamber 120 is chosen is such that the meniscuses formed in the holes of the porous material 110 prevent ambient gas from being drawn into the chamber 120 of the liquid removal device 70. However, when the surface of the porous material 110 comes into contact with liquid there is no meniscus to restrict flow and the liquid can flow freely into the chamber 120 of the liquid removal device 70.

The porous material 110 has a large number of small holes each with a dimension, e.g. a width, such as a diameter, in the range of 5 to 50 micrometers. The porous material 110 may be maintained at a height in the range of 50 to 300 micrometers above a surface, such as a facing surface, from which liquid is to be removed, e.g. the surface of a substrate W. In an embodiment, porous material 110 is at least slightly liquidphilic, i.e. having a dynamic contact angle of less than 90°, desirably less than 85° or desirably less than 80°, to the immersion liquid, e.g. water.

Although not specifically illustrated in FIG. 6, the liquid supply system has an arrangement to deal with variations in the level of the liquid. This is so that liquid which builds up between the projection system PS and the liquid confinement structure 12 can be dealt with and does not escape. One way of dealing with this liquid is to provide a lyophobic (e.g., hydrophobic) coating. The coating may form a band around the top of the liquid confinement structure 12 surrounding the opening and/or around the last optical element of the projection system PS. The coating may be radially outward of the optical axis of the projection system PS. The lyophobic (e.g., hydrophobic) coating helps keep the immersion liquid in the space 11.

Another localized area arrangement is a fluid handling system which makes use of a gas drag principle. The so-called gas drag principle has been described, for example, in United States patent application publication nos. US 2008-0212046, US 2009-0279060 and US 2009-0279062. In that system the extraction holes are arranged in a shape which may desirably have a corner. The corner may be aligned with a preferred direction of movement, such as the stepping or the scanning direction. This reduces the force on the meniscus between two openings in the surface of the fluid handing structure for a given speed in the preferred direction compared to if the two outlets were aligned perpendicular to the preferred direction. However, an embodiment of the invention may be applied to a fluid handling system which in plan has any shape, or has a component such as the extraction openings arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star.

In a variation of the system of US 2008/0212046 A1, to which an embodiment of the present invention may relate, the geometry of the cornered shape in which the openings are arranged allows sharp corners (between about 60° and 90°, desirably between 75° and 90° and most desirably between 75° and 85°) to be present for the corners aligned both in the scan and in the stepping directions. This allows increased speed in the direction of each aligned corner. This is because the creation of liquid droplets due to an unstable meniscus, for example in exceeding a critical speed, in the scanning direction is reduced. Where corners are aligned with both the scanning and stepping directions, increased speed may be achieved in those directions. Desirably the speed of movement in the scanning and stepping directions may be substantially equal.

Figure 7:
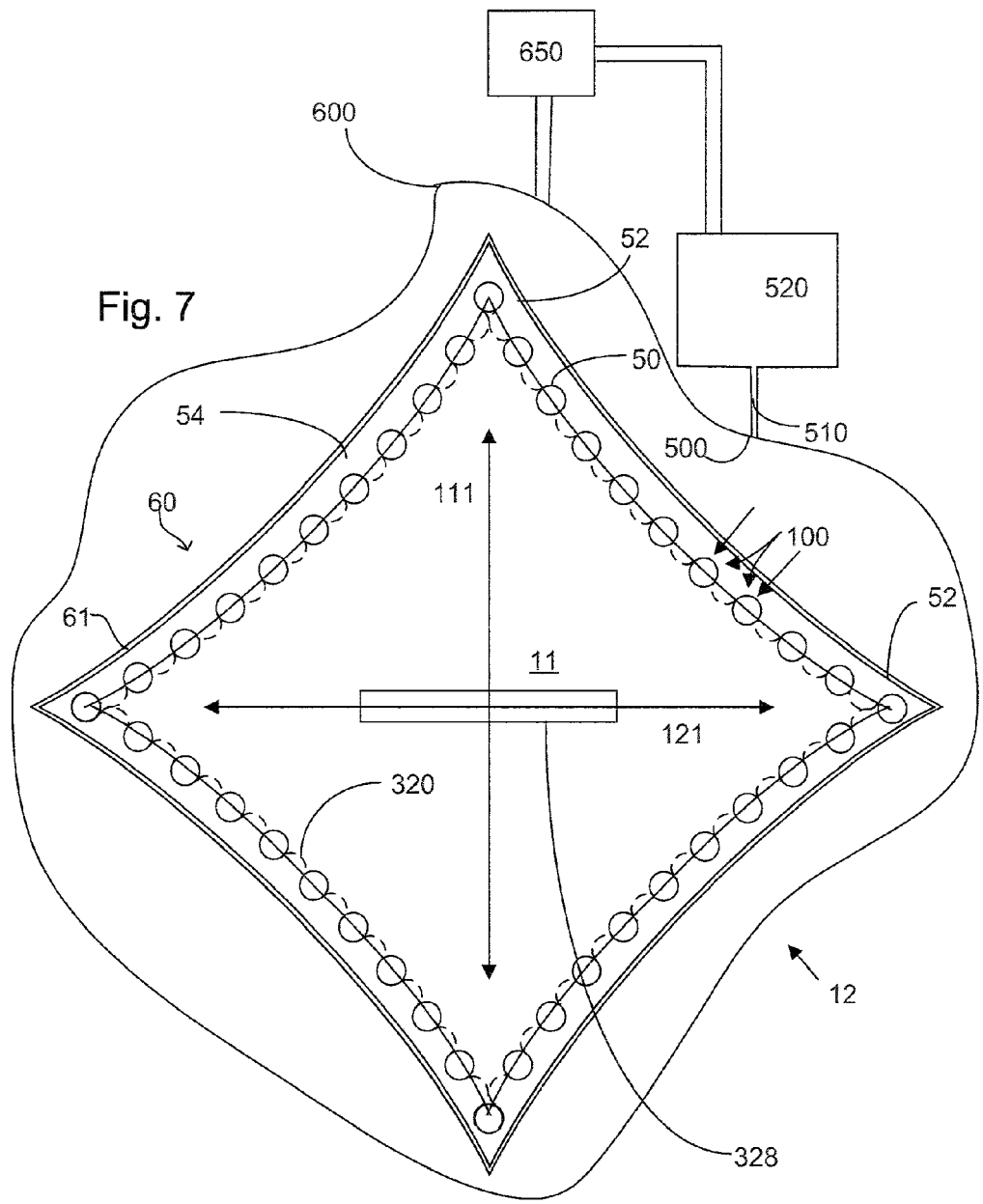
FIG. 7 depicts, in plan, a liquid supply system for use in a lithographic projection apparatus.

FIG. 7 illustrates schematically and in plan meniscus pinning features of a fluid handling system or of a liquid confinement structure 12 having an extractor embodying the gas drag principle and to which an embodiment of the present invention may relate. The features of a meniscus pinning device are illustrated which may, for example, replace the meniscus pinning arrangement 14, 15, 16 of FIG. 5 or at least the extractor assembly 70 shown in FIG. 6. The meniscus pinning device of FIG. 7 is a form of extractor. The meniscus pinning device comprises a plurality of discrete openings 50. Each opening 50 is illustrated as being circular, though this is not necessarily the case. Indeed one or more of the openings 50 may be one or more selected from: circular, elliptical, rectilinear (e.g. square, or rectangular), triangular, etc. and one or more openings may be elongate. Each opening has, in plan, a length dimension (i.e. in the direction from one opening to the adjacent opening) of greater than or equal to 0.2 mm, desirably greater than or equal to 0.5 mm or 1 mm, in an embodiment selected from the range of 0.1 mm to 10 mm, in one embodiment selected from the range of 0.25 mm to 2 mm. In an embodiment the width of each opening is selected from the range of 0.1 mm to 2 mm. In an embodiment the width of each opening is selected from the range of 0.2 mm to 1 mm.

In an embodiment the length dimension is in the range of 0.2 mm to 0.5 mm, desirably in the range of 0.2 mm to 0.3 mm.

Each of the openings 50 of the meniscus pinning device of FIG. 7 may be connected to a separate under pressure source. Alternatively or additionally, each or a plurality of the openings 50 may be connected to a common chamber or manifold (which may be annular) which is itself held at an under pressure. In this way a uniform under pressure at each or a plurality of the openings 50 may be achieved. The openings 50 can be connected to a vacuum source and/or the atmosphere surrounding the fluid handling system (or confinement structure) may be increased in pressure to generate the desired pressure difference.

In the embodiment of FIG. 7 the openings are fluid extraction openings. Each opening is an inlet for the passage of gas, liquid, or a two phase fluid of gas and liquid, into the fluid handling system. Each inlet may be considered to be an outlet from the space 11.

The openings 50 are formed in a surface of a fluid handling structure 12. The surface faces the substrate W and/or substrate table WT, in use. In an embodiment the openings are in a flat surface of the fluid handling structure 12. In an embodiment, a ridge may be present on the bottom surface of the substrate member. At least one of the openings may be in the ridge. The openings 50 may be defined by needles or tubes. The bodies of some of the needles, e.g., adjacent needles, may be joined together. The needles may be joined together to form a single body. The single body may form the cornered shape.

The openings 50 are the end of a tube or elongate passageway, for example. Desirably the openings are positioned such that in use they are directed, desirably face, to the facing surface, e.g. the substrate W. The rims (i.e. outlets out of a surface) of the openings 50 may be substantially parallel to a top surface of a part of the facing surface. An elongate axis of the passageway to which the opening 50 is connected may be substantially perpendicular (within +/−45°, desirably within 35°, 25° or even 15° from perpendicular) to the top of the facing surface, e.g., the top surface of the substrate W.

Each opening 50 is designed to extract a mixture of liquid and gas. The liquid is extracted from the space 11 whereas the gas is extracted from the atmosphere on the other side of the openings 50 to the liquid. This creates a gas flow as illustrated by arrows 100 and this gas flow is effective to pin the meniscus 320 between the openings 50 substantially in place as illustrated in FIG. 7. The gas flow helps maintain the liquid confined by momentum blocking, by a gas flow induced pressure gradient and/or by drag (shear) of the gas (e.g., air) flow on the liquid.

The openings 50 surround the space to which the fluid handling structure supplies liquid. The openings 50 may be distributed in an undersurface of the fluid handling structure. The openings 50 may be substantially continuously spaced around the space (although the spacing between adjacent openings 50 may vary). In an embodiment of the present invention liquid is extracted all the way around the cornered shape and is extracted substantially at the point at which it impinges on the cornered shape. This is achieved because the openings 50 are formed all the way around the space (in the cornered shape). In this way the liquid may be confined to the space 11. The meniscus may be pinned by the openings 50, during operation.

As can be seen from FIG. 7, the openings 50 are positioned so as to form, in plan, a cornered shape (i.e. a shape with corners 52). In the case of FIG. 7 this is in the shape of a rhombus, desirably a square, with curved edges or sides 54. The edges 54, if curved, have a negative radius. The edges 54 may curve towards the center of the cornered shape in areas away from the corners 52. An embodiment of the invention may be applied to any shape, in plan, including, but not limited to the shape illustrated, for example, a rectilinear shape, e.g. a rhombus, a square or rectangle, or a circular shape, a triangular shape, a star shape, an elliptical shape, etc.

The cornered shape has principal axes 111, 121 aligned with the major directions of travel of the substrate W under the projection system PS. This helps ensure that, below a critical scan speed, the maximum scan speed is faster than if the openings 50 were arranged in a circular shape. This is because the force on the meniscus between two openings 50 is reduced with a factor cos θ. Here θ is the angle of the line connecting the two openings 50 relative to the direction in which the substrate W is moving.

The use of a square cornered shape allows movement in the step and scanning directions to be at an equal maximum speed. This may be achieved by having each of the corners 52 of the shape aligned with the scanning and stepping directions 111, 121. If movement in one of the directions, for example the scan direction is preferred to be faster than movement in the step direction then a rhombus shape could be used. In such an arrangement the primary axis of the rhombus may be aligned with the scan direction. For a rhombic shape, although each of the corners may be acute, the angle between two adjacent sides of the rhombus, for example in the stepping direction, may be obtuse, i.e. more than 90° (for example selected from the range of about 90° to 120°, in an embodiment selected from the range of about 90° to 105°, in an embodiment selected from the range of about 85° to 105°).

Throughput can be optimized by making the primary axis of the shape of the openings 50 aligned with the major direction of travel of the substrate (usually the scan direction) and to have a second axis aligned with the other major direction of travel of the substrate (usually the step direction). It will be appreciated that any arrangement in which θ is different to 90° will give an advantage in at least one direction of movement. Thus, exact alignment of the principal axes with the major directions of travel is not vital.

An advantage of providing the edges with a negative radius is that the corners may be made sharper. An angle selected from the range of 75 to 85° or even lower may be achievable for both the corners 52 aligned with the scan direction and the corners 52 aligned with the step direction. If it were not for this feature then in order for the corners 52 aligned in both directions to have the same angle, those corners would have to have 90°. If less than 90° were desired it would be necessary to select one direction to have corners with less than 90° with the result that the other corner would have an angle of greater than 90°.

There may be no meniscus pinning features radially inwardly of the openings 50. The meniscus is pinned between the openings 50 with drag forces induced by gas flow into the openings 50. A gas drag velocity of greater than about 15 m/s, desirably about 20 m/s is sufficient. The amount of evaporation of liquid from the substrate may be reduced thereby reducing both splashing of liquid as well as thermal expansion/contraction effects.

In an embodiment, at least thirty-six (36) discrete openings 50 each with a diameter of 1 mm and separated by 3.9 min may be effective to pin a meniscus. In an embodiment, one hundred and twelve (112) openings 50 are present. The openings 50 may be square, with a length of a side of 0.5 mm, 0.3 mm, 0.2 mm or 0.1 mm. The total gas flow in such a system is of the order of 100 l/min. In an embodiment the total gas flow is selected from the range of 70 l/min to 130 l/min.

Other geometries of the bottom of the fluid handling structure are possible. For example, any of the structures disclosed in U.S. patent application publication no. US 2004-0207824 or U.S. patent application no. U.S. 61/181,158, filed on 26 May 2009, could be used in an embodiment of the present invention.

As can be seen in FIG. 7, relative to the space 11, one or more slits 61 may be provided outside the openings 50. The slit 61 may be substantially parallel to the lines joining the openings 50. In an embodiment the slit 61 may be a series of discrete apertures provided along a side 54 of the shape. In use, the slit 61 is connected to an over pressure and forms a gas knife 60 surrounding the meniscus pinning device formed by openings 50.

The gas knife 60 in an embodiment of the invention functions to reduce the thickness of any liquid film left on a facing surface, such as the substrate W or substrate table WT. The gas knife 60 helps ensure that the liquid film does not break into droplets but rather the liquid is driven towards the openings 50 and extracted. In an embodiment the gas knife 60 operates to prevent the formation of a film. To achieve this, it is desirable that the distance between the center lines of the gas knife and of the meniscus pinning openings 50 is in the range of from 1.5 mm to 4 mm, desirably from 2 mm to 3 mm. The line along which the gas knife 60 is arranged generally follows the line of the openings 50 so that the distance between adjacent ones of the openings 50 and the slit 61 of the gas knife 60 is within the aforementioned ranges. Desirably the line along which the gas knife 60 is arranged is parallel to the line of the openings 50. It is desirable to maintain a constant separation between adjacent ones of the openings 50 and the slit 61 of the gas knife 60. In an embodiment this is desirable along the length of each center line of the gas knife. In an embodiment the constant separation may be in the region of one of more corners of the liquid handling device.

Localized area fluid handling systems such as those described above, with reference to FIGS. 2-7, can suffer from bubble inclusion into the space 11. As can be seen, a meniscus 320 extends between the fluid handling system 12 and the surface under the fluid handling system 12. This meniscus 320 defines the edge of the space 11. When the meniscus 320 and a droplet collide on the surface, for example a droplet of liquid which has escaped the space 11, a bubble of gas may be included into the space 11. Inclusion of a bubble into the space 11 is detrimental because a bubble of gas can lead to an imaging error. A droplet is usually left behind on the surface in one of at least three circumstances: (a) when the liquid handling device is located over the edge of a substrate W when there is relative movement between the liquid handling device and the substrate W; (b) when the liquid handling device is located over a step change in height of the facing surface facing the liquid confinement structure when there is relative movement between the liquid handling device and the facing surface; and/or (c) due to too high relative speed between the liquid handling device and the facing surface, for example when the meniscus becomes unstable, e.g. by exceeding the critical scan speed of the facing surface. A bubble may be included at the meniscus 400 illustrated in FIGS. 5 and 6 extending between the liquid confinement structure 12 and the projection system PS. Here a bubble of gas could be created by liquid supplied from a liquid inlet (inlet 13 in FIG. 5 and inlets 20 in FIG. 6) on the radially inward facing surface of the liquid handling system 12 entraining gas from between the projection system PS and the liquid handling device 12.

Ways of dealing with the difficulty of bubble inclusion have concentrated on improving the confinement properties of a liquid confinement structure 12. For example, the relative speed between the liquid confinement structure 12 and the facing surface has been decreased in order to avoid spilling of liquid.

Very small bubbles of gas may dissolve in the immersion liquid before they reach the exposure area 328 (illustrated in FIG. 7) of the space 11. An embodiment of the present invention uses the fact that dissolution speed is dependent upon the type of the trapped gas and the immersion liquid properties.

A bubble of carbon dioxide ($CO_2$) typically dissolves faster than a bubble of air. A bubble of $CO_2$ which has a solubility fifty-five (55) times larger than that of nitrogen and a diffusivity of 0.86 times that of nitrogen will typically dissolve in a time thirty-seven (37) times shorter than the time for a bubble of the same size of nitrogen to dissolve.

An experiment was carried out in which ultra pure water had been degassed by boiling it. The water was then cooled and a vacuum of —950 mbar was applied. Bubbles of ambient air and $CO_2$ were placed on the edge of a substrate placed in the water. The bubbles had a size of between 0.5 and 1 mm. After 30 seconds, the size of the bubbles of $CO_2$ had reduced to between 0.1 mm and 0.3 mm and the bubbles of $CO_2$ were no larger than 0.1 mm after 1 minute. During this time the size of the bubbles of air did not vary appreciably.

An analytical formula for the change in bubble diameter with time is:

$$\frac{dD_{bub}}{dt} = \frac{Sh \cdot Diff \cdot Sol \cdot RT\left(P_{hyd} + \frac{4\sigma}{D_{bub}}\right)}{\frac{1}{2}P_{hyd}D_{bub} + \frac{4}{3}\sigma}$$

where: R is the universal gas constant; T the temperature; Diff the diffusivity; Sol the solubility; t time; $D_{bub}$ the diameter of the bubble; Sh the Sherwood number (kd/Diff, where: k is the mass transfer coefficient and d the characteristic dimension); $P_{hyd}$ is the hydraulic pressure; and r is the surface tension.

The equation shows that $CO_2$ bubbles with a diameter of lower than 1 mm will dissolve in the time scale of 1 or 2 minutes. In comparison, a bubble of nitrogen will dissolve in the hour time scale. This is in agreement with the above mentioned experiment.

Another analytical model relates dissolution time τ to the bubble diameter, diffusivity, solubility, the universal gas constant and temperature.

$$\tau = \frac{D_{bub}^2}{6Sh \cdot Diff \cdot Sol \cdot RT}$$

The second equation shows that a bubble of $CO_2$ of 1 mm diameter will dissolve in about 70 seconds compared to 110 seconds predicted by the first analytical model.

Therefore, the experimental result broadly agrees with the above two analytical models. Faster dissolution is achieved by a higher solubility and/or a higher mass transfer coefficient. For a given set of flow conditions and geometry, to a first order approximation, the Sherwood number is independent of the gas or liquid concerned. This shows that the mass transfer coefficient and diffusivity are substantially proportional. Therefore although the diffusivities on the top line of the first equation and on the bottom line of the second equation cancel out, because the mass transfer coefficient is proportional to diffusivity, a higher diffusivity leads to faster dissolution. Therefore suitable gasses may have a higher solubility and/or a higher diffusivity. Suitable gases may have a product of diffusivity and solubility in the immersion liquid which is greater than that of air.

Figure 8:
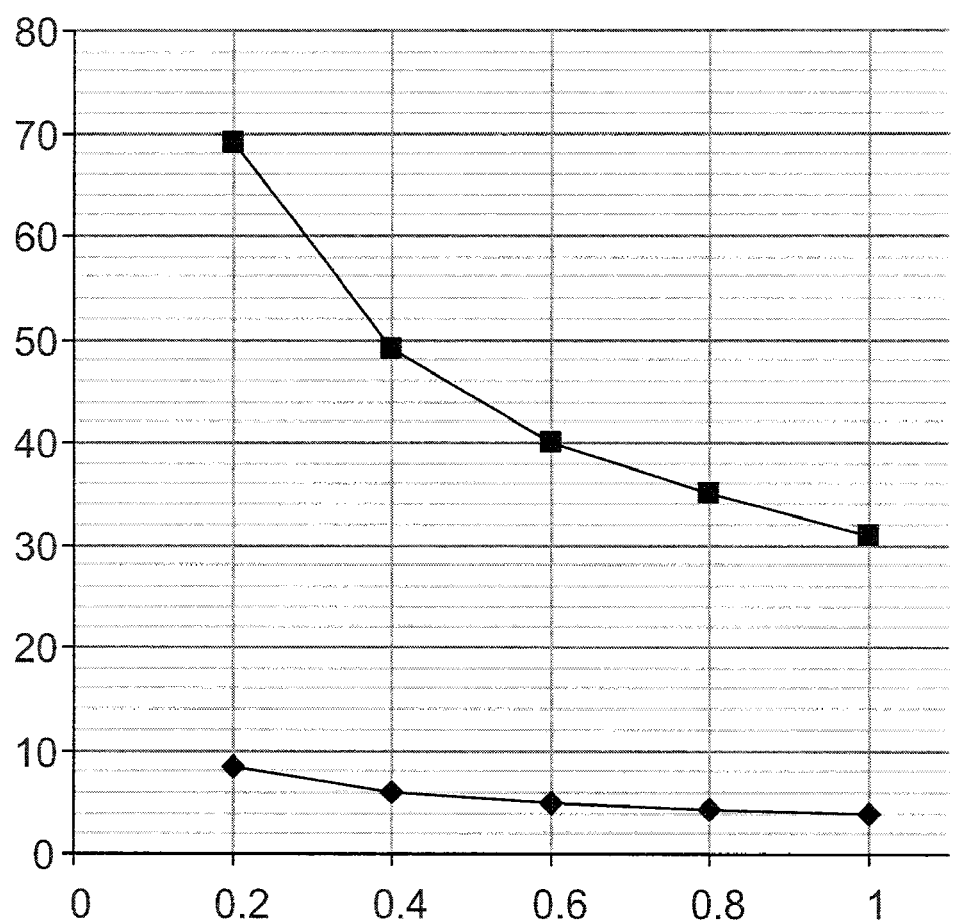
FIG. 8 is a graph showing permittable bubble size versus scan speed.

Using the results obtained by the analytical models it is possible to determine about how quickly a bubble of a particular gas can be expected to dissolve in liquid. A bubble included at the meniscus 320 may be stationary relative to the facing surface, and may be positioned on the substrate. The bubble may move through the space towards the exposure area 328. In order for no imaging defects to occur, an included bubble desirably dissolves before it reaches the exposure area 328 to be exposed by the projection beam B. For a given fluid handling system the distance between the expected position of the meniscus 320 and the exposure area 328 is known. The distance of travel of the bubble may be equivalent to the distance of travel of the substrate W to travel under the projection system PS from the position at which the bubble is included into the liquid to the position at which the bubble is in the exposure area. So for a high scan speed a bubble will need to dissolve faster than for a slow scan speed, because the time taken for the bubble to reach the exposure area 328 from the meniscus 320 will be less than for a lower scan speed. FIG. 8 shows calculations for a particular geometry of fluid handling system with a distance between the expected position of the meniscus 320 and the exposure area 328 being about 30 mm for various scan speeds. The maximum allowable size of a bubble (on the y-axis) of carbon dioxide (squares) and of a bubble of nitrogen (diamonds) is plotted against scan speed (on the x-axis). As can be seen, the maximum allowable bubble diameter of a $CO_2$ bubble is much greater (approximately 8 times) than the maximum allowable bubble diameter of nitrogen.

If the bubble of gas is of a gas which has a high diffusivity, solubility or product of diffusivity and solubility in the immersion liquid, it will dissolve into the immersion liquid much faster according to the above two analytical models. Therefore, using an embodiment of the invention will reduce the number of imaging defects thereby allowing higher throughput (e.g., higher speed of the substrate W relative to the liquid handling system 12) and lower defectivity.

Therefore, an embodiment of the present invention provides a gas supplying device configured to supply gas to a region (e.g. to a volume, or a towards an area) adjacent the space 11. In particular, gas is provided such that it is present in the region adjacent to the meniscus 320 extending between the facing surface and the liquid handling device 12 and/or adjacent to the meniscus 400 extending between the liquid handling device 12 and the projection system PS.

Gases which are suitable are, for example, those with solubilities (mass of gas per unit mass of immersion liquid at a total pressure of 1 atm (sum of the partial pressures of gas and immersion liquid)) in the immersion liquid (for example, water) of greater than $1\times10^{-3}$ at 20° C. and 1 atm total pressure. Volume of gas rather than weight of gas may be more important because a certain volume of gas rather than weight is needed to fill the region adjacent the space. Therefore, the solubility may be better expressed in mols of gas per kg of liquid (i.e. in mol/kg). In that case the solubility should be greater than $5\times10^{-3}$ mol/kg, desirably greater than $10\times10^{-3}$ mol/kg, $15\times10^{-3}$ mol/kg, $20\times10^{-3}$ mol/kg or $25\times10^{-3}$ mol/kg.

Gases which are suitable are, for example, those with diffusivities of greater than $3\times10^{-5}$ cm$^2$ s$^{-1}$ at 20° and 1 atm total pressure. This compares to that of air which is $2.3\times10^{-5}$ cm$^2$ s$^{-1}$. Desirably the diffusivity is greater than $8\times10^{-5}$, $1\times10^{-4}$, or $5\times10^{-4}$ cm$^2$ s$^{-1}$. Most gasses have a diffusivity of between $1$-$2\times10^{-5}$ cm$^2$ s$^{-1}$. Both oxygen and nitrogen have a diffusivity of $2.3\times10^{-5}$ cm$^2$ s$^{-1}$ and carbon dioxide is $1.6\times10^{-5}$ s$^{-1}$.

Helium has a diffusivity of $3.8\times10^{-5}$ cm$^2$ s$^{-1}$ (and a solubility of $1.6\times10^{-6}$ kg/kg or $4\times10^{-4}$ mol/kg). Hydrogen has a diffusivity of $5.8\times10^{-5}$ cm$^2$ s$^{-1}$ (and a solubility of $1.6\times10^{-6}$ kg/kg or $8\times10^{-4}$ mol/kg).

Particularly desirable are gases with solubilities of greater than $1\times10^{-3}$ kg/kg or $3\times10^{-3}$ mol/kg at 20° C. and 1 atm total pressure and/or diffusivities in the immersion liquid of greater than $3\times10^{-5}$ cm$^2$ s$^{-1}$ at 20° C. and 1 atm pressure. In an embodiment the gas is a gas which has a product of diffusivity and solubility greater than that of air. For example, the product of diffusivity and solubility should be greater than $0.1\times10^{-9}$ cm$^2$ s$^{-1}$ (using a mass ratio for the solubility) or $2\times10^{-8}$ mol cm$^2$ s$^{-1}$ kg$^{-1}$ (using mol/kg for solubility). Desirably the product of solubility and diffusivity is greater than $5\times10^{-9}$, $1\times10^{-8}$ or $3\times8^{-8}$ cm$^2$ s$^{-1}$ (using a mass ratio for the solubility) or $4\times10^{-8}$, $10\times10^{-8}$, $20\times10^{-8}$, $40\times10^{-8}$ or $50\times10^{-8}$ cm$^2$ s$^{-1}$ mol kg$^{-1}$ (using mol/kg for solubility). An example gas is carbon dioxide.

In an embodiment, gases with a product of solubility and diffusivity greater than that of air (at 20° C. and 1 atm total pressure) are used. The solubility may be measured in kg/kg or in mol/kg. Gases with those properties will dissolve in the immersion liquid faster than air thereby allowing a higher scan speed to be used without risk of bubbles included at the meniscus 320, 400 from still being present in the exposure area at exposure time.

An example gas is carbon dioxide which may be desirable because it is readily available and may be used in immersion systems for other purposes. Carbon dioxide has solubility in water at 20° C. and 1 atm total pressure of $1.69\times10^{-3}$ kg/kg or $37\times10^{-3}$ mol/kg. Other suitable gases may be chlorine ($7.0\times10^{-3}$ kg/kg or $98\times10^{-3}$ mol/kg), hydrogen sulphide ($3.85\times10^{-3}$ kg/kg or $113\times10^{-3}$ mol/kg), hydrogen chloride ($0.721$ kg/kg or $19753\times10^{-3}$ mol/kg), ammonia ($0.531$ kg/kg or $31235\times10^{-3}$ mol/kg) or sulphur dioxide ($0.113$ kg/kg or $1765\times10^{-3}$ mol/kg). Some of those gases may have one or more disadvantages. For example, some of those gases may react with components in the immersion lithographic apparatus and/or may be poisonous and may therefore be harder to handle and less desirable than carbon dioxide. Any non-reactive gas which readily dissolves in immersion liquid is suitable.

These gases used in an embodiment of the invention contrast to oxygen and nitrogen which have solubilities in water of $4.34\times10^{-5}$ kg/kg or $1.36\times10^{-3}$ mol/kg and $1.90\times10^{-5}$ kg/kg or $0.68\times10^{-3}$ mol/kg at 20° C. and 1 atm total pressure respectively. Either of oxygen or nitrogen or air, of which those two gases form the predominant part, are therefore unlikely to dissolve before reaching the exposure area 325 of the space 11.

The gas supplying device supplies gas with a solubility in immersion liquid of greater than $1\times10^{-3}$ kg/kg or $5\times10^{-3}$ mol/kg at 20° C. and 1 atm total pressure to the exclusion of other gases. So any gas exiting the gas supply device may have a solubility of greater than $1\times10^{-3}$ kg/kg or $5\times10^{-3}$ mol/kg. Such a gas supplying device is therefore distinguishable from a gas supplying device supplying air (which includes carbon dioxide), because air includes oxygen and nitrogen which have lower solubilities than $1\times10^{-3}$ kg/kg or $5\times10^{-3}$ mol/kg.

An embodiment of the present invention herein described may form a $CO_2$ atmosphere around the meniscus 320, 400 of immersion liquid so that any inclusion of gas into the immersion liquid creates a gas inclusion which dissolves in the immersion liquid. Dissolving $CO_2$ in the immersion liquid prior to supplying the immersion liquid to the space (for example to change the resistivity of the immersion liquid)

provides the $CO_2$ as a solute and not a gas. Supplying a solute of $CO_2$ would not work in the same way as an embodiment of the present invention because the $CO_2$ is supplied in the immersion liquid. In providing the $CO_2$ as a solute in the immersion liquid instead of a gaseous atmosphere in the region of the meniscus, the $CO_2$ has already dissolved in the liquid in the space. The $CO_2$ is not present in the gas of an included bubble, so the presence of the $CO_2$ in the immersion liquid would not facilitate the reduction in the size of the included bubble. Such an arrangement could be considered to be contrary to the way an embodiment of the present invention works.

In an embodiment the immersion liquid is degassed prior to being supplied to the space 11. In an embodiment, minimal, desirably no, gas is dissolved in the immersion liquid after degassing and prior to being supplied to the space 11. In particular, no component exists deliberately to dissolve gas in the immersion liquid between the immersion liquid being degassed and being supplied to the space 11. Previously it has been suggested to dissolve carbon dioxide in immersion liquid prior to providing it to the space 11 in order to change the acidity or electrical conductivity of the immersion liquid, for example to help prevent corrosion of one or more components which contact the immersion liquid. However, addition of carbon dioxide need only be added sufficiently to prevent corrosion, below the concentration of carbon dioxide at which the effect of an embodiment of the present invention on an included bubble is not appreciable. In an embodiment of the present invention, a high concentration of carbon dioxide dissolved in the immersion liquid may be undesirable because deliberately dissolving gas into the immersion liquid above a certain concentration will reduce the solubility of that gas in immersion liquid. The presence of the gas in solution (at least above a certain threshold) could thereby reduce the likelihood that the gas of an included bubble will dissolve quickly enough to help reduce, if not avoid, the chance of an imaging defect.

In an embodiment, a gas atmosphere is created at the liquid meniscus 320, 400. That may include enclosing the exposure area of the immersion lithographic apparatus with gas. The exposure area is the entire area surrounding the end of the projection system PS. In an embodiment, the entire inside of the apparatus has the gas supplied to it. In an embodiment, a local supply of gas to the meniscus 320, 400 is provided. For example, separate openings 200, 201 can be provided in the barrier member 12 to provide gas to the meniscus 320, 400. In an embodiment, the gas may be provided through a gas knife, as described below. In an embodiment, gas may be supplied to the region of the barrier member, for example as a purging gas.

Typically the gas supplying device comprises a source of gas and an opening which is connected to the source of gas via a conduit. In an embodiment the gas is provided in a fluid handling system such as that illustrated in FIG. 7 without a gas knife 60, so that a gas atmosphere 600 of a high solubility gas surrounds the entire liquid handling device 12. The liquid confinement structure 12 is in a gas atmosphere 600, for example shrouded in a gas cloud, supplied in the region of the fluid handling system, for example as a purging gas. The gas could be provided through a gas opening 500 separate from (e.g. adjacent to) the liquid confinement structure 12. The opening 500 could be at the end of a conduit 510 which extends between the gas opening 500 and the source of gas 520. The gas opening 500 may be one or more openings around the periphery of the liquid confinement structure 12. The opening may surround the liquid confinement structure 12. The same or a similar system could be used in the other embodiments, particularly those of FIGS. 2 to 4.

In an embodiment, the opening for high solubility gas may be formed in the fluid handling system 12. The gas opening 200, 201 may be connected to the source of gas 520. For example, the gas opening may be an integral opening 200 formed in the surface of the liquid confinement structure 12, as shown in FIG. 6. The integral opening 200 is radially outward of the meniscus, and may be radially outward of the extractor 70, with respect to the optical axis of the projection system PS. Gas with high solubility in immersion liquid exiting the integral opening (or outlet) 200 may thereby be adjacent the meniscus 320. Gas exiting the integral opening 200 may be included into the immersion liquid in the space 11 in a gas bubble upon collision of a liquid droplet with the meniscus 320. Because the gas is easily absorbed into the immersion liquid, it will desirably be absorbed into the immersion liquid before reaching the optical path in the space 11. An integral opening 200 such as that illustrated in FIG. 6 could be in any type of fluid handling system 12, for example, at a position adjacent an extractor. In FIG. 6 is a further opening 201 to provide gas adjacent the meniscus 400 extending between the liquid confinement structure 12 and the projection system PS. The further opening 201 is radially outwardly of the expected position of the meniscus 400.

Pre-existing gas supplying features, such as a gas knife, shown in FIGS. 5, 6 and 7 could be used in the gas supplying device to supply the gas with high solubility in immersion liquid described herein. Gas supplied out of opening 15 in FIG. 5 could consist of the gas with a solubility in the immersion liquid of greater than $1\times10^{-3}$ kg/kg or $5\times10^{-3}$ mol/kg at 20° C. and 1 atm total pressure. The gas used in the gas knife 90 of FIG. 6 and the gas knife 60 of FIG. 7 could consist of a gas with a solubility in immersion liquid of greater than $1\times10^{-3}$ kg/kg or $5\times10^{-3}$ mol/kg at 20° C. and 1 atm total pressure. In each case, the opening 15, 90, 60 could be connected to the source of gas 520. Thus, existing designs of fluid handling system 12 could be used. In using an existing design of fluid handling system 12, the size of the system 12 can at least be maintained if not minimized.

The gas is supplied in such a way that environmental gas (e.g. air) is largely expelled from the environment of the liquid/gas separation line (e.g. at meniscus 320, 400). The gas may be supplied at or radially outward of the meniscus 320, 400. In an embodiment, the gas is supplied as a purging gas to shield the meniscus from the ambient environmental gas. In an embodiment, the gas is supplied to confine the liquid in the reservoir or immersion space. The gas may be supplied between the liquid handling system and a facing surface (for example, a substrate table and/or a substrate) to form a seal therebetween. The supplied gas may form a barrier between the meniscus of the immersion liquid and the ambient atmosphere of, for example, air.

The atmosphere to which meniscus 320, 400 is exposed is mainly the supplied gas. Therefore, in the absence of bubble formation, gas dissolves into the immersion liquid at the meniscus 320, 400. Over time the concentration of the supplied gas may increase. Liquid at the meniscus is consequently affected most by the supplied gas. The increased concentration of the supplied gas may affect optical properties of the immersion liquid, for example its refractive index. However, continual extraction of liquid from the space 11 at the meniscus helps prevent the liquid radially inward of the meniscus from being substantially affected by the increased concentration of the gas.

However, any bubble which is formed at the meniscus, for example on collision with a droplet, is likely to include a gas bubble at least largely of the supplied gas. The bubble, as it contains the supplied gas, readily dissolves in the immersion liquid, beyond the region of extraction of, for example, outlet 14, openings 50, or extractor 70. Because the bubble desirably dissolves before it reaches the exposure area 325, i.e. the path of the projection beam through the space 11, most of the gas of the bubble dissolves in the immersion liquid before it reaches the exposure area 325. Since most of the liquid in the path of the bubble is extracted near the meniscus, it is likely that the liquid in which the supplied gas is dissolved, is extracted before it significantly affects the optical properties of the immersion liquid in the space.

By using gaseous $CO_2$ the problem associated with the meniscus 320 colliding with a droplet of liquid may be reduced if not alleviated. Typically a droplet of 300 micrometers would produce a bubble of 30 micrometers in diameter (i.e. a tenth the size). Such a bubble of carbon dioxide would usually dissolve in the immersion liquid before reaching the exposure area. (Note that a droplet of such a size may cause one or more other problems). Therefore the problems caused by a droplet would be less significant. The immersion system would be more tolerant of interacting with immersion liquid which had escaped from the space.

A re-cycling device 650 may be used to collect any undissolved gas from a gas supplying device and return the undissolved gas to the gas source 520 of the gas supplying device for re-use. It should be noted that a fluid handling system applying the gas drag principle, as described with reference to FIG. 7, is likely to use a large quantity of gas from a gas supplying device as compared to a liquid supply device using a single phase extractor such described with reference to FIG. 6. Therefore, a recycling device 650 may be particularly advantageous for use with an fluid handling system which applies the gas drag principle.

As will be appreciated, any of the above described features can be used with any other feature and it is not only those combinations explicitly described which are covered in this application. For example, an embodiment of the invention could be applied to the embodiments of FIGS. 2 to 4.

In an embodiment, there is provided an immersion lithographic apparatus comprising: a fluid handling system configured to confine immersion liquid to a localized space between a final element of a projection system and a substrate and/or table; and a gas supplying device configured to supply gas with a solubility in the immersion liquid of greater than $5\times10^{-3}$ mol/kg at 20° C. and 1 atm total pressure to a region adjacent the space.

In an embodiment, the gas supplying device comprises a source of gas with a solubility in immersion liquid of greater than $5\times10^{-3}$ mol/kg at 20° C. and 1 atm total pressure.

In an embodiment, there is provided an immersion lithographic apparatus comprising: a fluid handling system configured to confine immersion liquid to a localized space between a final element of a projection system and a substrate and/or table; and a gas supplying device configured to supply gas with a diffusivity in the immersion liquid of greater than $3\times10^{-5}$ cm$^2$ s$^{-1}$ at 20° C. and 1 atm total pressure to a region adjacent the space.

In an embodiment, the gas supplying device comprises a source of gas with a diffusivity in immersion liquid of greater than $8\times10^{-5}$ cm$^2$ s$^{-1}$ at 20° C. and 1 atm total pressure.

In an embodiment, there is provided an immersion lithographic apparatus comprising: a fluid handling system configured to confine immersion liquid to a localized space between a final element of a projection system and a substrate and/or table; and a gas supplying device configured to supply gas with a product of diffusivity and solubility in the immersion liquid of greater than that of air at 20° C. and 1 atm total pressure to a region adjacent the space.

In an embodiment, the gas supplying device comprises a source of gas with a product of diffusivity and solubility in immersion liquid of greater than $2\times10^{-8}$ cm$^2$ s$^{-1}$ mol kg$^{-1}$ at 20° C. and 1 atm total pressure.

In an embodiment, the source of gas is a source of carbon dioxide. In an embodiment, the gas supplying device comprises an opening through which gas is supplied. In an embodiment, the gas supply device is configured to supply gas to fill an exposure area of the immersion lithographic apparatus with the gas. In an embodiment, the opening is adjacent the fluid handling system. In an embodiment, the opening is positioned to supply the gas to a local area adjacent the localized space. In an embodiment, the fluid handling system comprises a liquid confinement structure. In an embodiment, the gas supplying device, desirably the opening, is positioned to shroud the liquid confinement structure in the gas. In an embodiment, the gas supplying device, desirably the opening, is positioned to provide an atmosphere consisting of the gas in which the liquid confinement structure is situated. In an embodiment, the gas supplying device is configured to supply gas to a region adjacent a meniscus extending between the liquid confinement structure and the substrate and/or table and/or between the liquid confinement structure and the projection system. In an embodiment, the liquid confinement structure includes an extractor. In an embodiment, the extractor comprises a porous member. In an embodiment, the extractor comprises a plurality of openings in the liquid confinement structure. In an embodiment, the gas supplying device comprises an opening in the liquid confinement structure radially outwardly of the extractor. In an embodiment, the opening forms a gas knife or gas seal. In an embodiment, the immersion lithographic apparatus further comprises a recycling device to collect any undissolved gas from the gas supplying device and return the undissolved gas to the gas supplying device for re-use.

In an embodiment, there is provided a device manufacturing method, comprising: projecting a patterned beam of radiation through an immersion liquid confined to a localized space between a final element of a projection system and a substrate; and providing to a region adjacent to the space a gas with a solubility in the immersion liquid of greater than $5\times10^{-3}$ mol/kg at 20° C. and 1 atm total pressure.

In an embodiment, there is provided a device manufacturing method, comprising: projecting a patterned beam of radiation through an immersion liquid confined to a localized space between a final element of a projection system and a substrate; and providing to a region adjacent to the space a gas with a diffusivity in the immersion liquid of greater than $3\times10^{-5}$ cm$^2$ s$^{-1}$ at 20° C. and 1 atm total pressure.

In an embodiment, there is provided a device manufacturing method, comprising: projecting a patterned beam of radiation through an immersion liquid, confined to a localized space between a final element of a projection system and a substrate; and providing to a region adjacent to the space a gas with a product of diffusivity and solubility in the immersion liquid of greater than that of air at 20° C. and 1 atm total pressure.

In an embodiment, the provided gas expels other gas from the area. In an embodiment, the gas is carbon dioxide.

In an embodiment, there is provided a fluid handling system for an immersion lithographic apparatus, the fluid handling system configured to confine immersion liquid to a localized space between a final element of a projection system and a substrate and/or table, and comprising a gas supplying device configured to supply gas with a solubility in the immersion liquid of greater than $5\times10^{-3}$ mol/kg at 20° C. and 1 atm total pressure to a region adjacent the space.

In an embodiment, there is provided a fluid handling system for an immersion lithographic apparatus, the fluid handling system configured to confine immersion liquid to a localized space between a final element of a projection system and a substrate and/or table; and comprising a gas supplying device configured to supply gas with a diffusivity in the immersion liquid of greater than $3\times10^{-5}$ cm$^2$ s$^{-1}$ at 20° C. and 1 atm total pressure to a region adjacent the space.

In an embodiment, there is provided a fluid handling system for an immersion lithographic apparatus, the fluid handling system configured to confine immersion liquid to a localized space between a final element of a projection system and a substrate and/or table; and comprising a gas supplying device configured to supply gas with a product of diffusivity and solubility in the immersion liquid of greater than that of air at 20° C. and 1 atm total pressure to a region adjacent the space.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general teens "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable, instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A system, comprising:
   a movable table;
   a projection system configured to project a beam of radiation onto a substrate, the projection system comprising an optical element nearest the table;
   a fluid handling system configured to confine immersion liquid to a localized liquid space between the element of the projection system and the table, the fluid handling system comprising a liquid confinement structure arranged to define a first gap between the liquid confinement structure and the projection system and define a second gap between the liquid confinement structure and the table; and
   a gas supply device configured to supply gas to a region adjacent the liquid space, the gas having a solubility in the immersion liquid of greater than $5\times10^{-3}$ mol/kg at 20° C. and 1 atm total pressure and the gas supply device comprising one or more openings arranged to supply the gas to the first and second gaps, the one or more openings separate from the liquid confinement structure and the one or more openings positioned to provide the gas such that the gas substantially surrounds the localized liquid space and substantially separates the localized liquid space from a different ambient gas atmosphere that surrounds the localized liquid space and comes into contact around the localized liquid space with the gas.

2. The system of claim 1, wherein the gas comprises carbon dioxide.

3. The system of claim 1, wherein the gas supply device is positioned to shroud at least an exterior peripheral surface of the liquid confinement structure in the gas.

4. The system of claim 1, further comprising a recycling device configured to collect the gas that has not become incorporated into the immersion liquid and provide such gas to the gas source for re-use.

5. A system, comprising:
a fluid handling system configured to confine immersion liquid to a localized liquid space between a final element of a projection system of an immersion lithographic apparatus and a table of an immersion lithographic apparatus, the fluid handling system comprising a liquid confinement structure arranged to define a first gap between the liquid confinement structure and the projection system and define a second gap between the liquid confinement structure and the table;
a gas supply device configured to supply gas from a gas source to a region adjacent the liquid space, the gas having a product of diffusivity and solubility in the immersion liquid of greater than that of air at 20° C. and 1 atm total pressure, and the gas supply device comprising one or more openings arranged to supply the gas to the first and second gaps, the one or more openings outward of the body of the liquid confinement structure and the one or more openings positioned to provide the gas such that the gas substantially surrounds the localized liquid space and substantially separates the localized liquid space from a different ambient gas atmosphere that surrounds the localized liquid space and comes into contact around the localized liquid space with the gas; and
a recycling device configured to collect the gas that has not become incorporated into the immersion liquid and provide such gas to the gas source for re-use.

6. The system of claim 5, wherein the gas supply device comprises a source of gas with a product of diffusivity and solubility in immersion liquid of greater than $2 \times 10^{-8}$ $cm^2$ $s^{-1}$ $mol$ $kg^{-1}$ at 20° C. and 1 atm total pressure.

7. The system of claim 6, wherein the source of gas is a source of carbon dioxide.

8. The system of claim 5, wherein the gas supply device is positioned to shroud at least an exterior peripheral surface of the liquid confinement structure in the gas.

9. The system of claim 5, wherein the one or more openings are outward of a lateral surface of the liquid confinement structure.

10. A device manufacturing method, comprising:
projecting a patterned beam of radiation through an immersion liquid confined to a localized space between a final element of a projection system and a substrate;
providing gas from a gas source to a region adjacent to the immersion liquid in the space, the gas having a solubility in the immersion liquid of greater than $5 \times 10^{-3}$ mol/kg at 20° C. and 1 atm total pressure; and
other than or in addition to dissolving the gas into the liquid, forming bubbles in the immersion liquid from the gas supplied to the region adjacent to the immersion liquid the bubbles included into immersion liquid by collision of a liquid droplet with a meniscus of the immersion liquid in the space.

11. The method of claim 10, wherein the gas has a product of diffusivity and solubility in the immersion liquid of greater than that of air at 20° C. and 1 atm total pressure.

12. The method of claim 10, wherein the gas has a product of diffusivity and solubility in immersion liquid of greater than $2 \times 10^{-8}$ $cm^2$ $s^{-1}$ $mol$ $kg^{-1}$ at 20° C. and 1 atm total pressure.

13. The method of claim 10, wherein the gas comprises carbon dioxide.

14. The method of claim 10, further comprising recycling gas that has not become incorporated into the immersion liquid to the gas source for re-use.

15. The method of claim 10, wherein the providing gas comprises providing the gas from one or more openings outward of the body of a liquid confinement structure, the liquid confinement structure confining the immersion liquid to the localized space.

16. The method of claim 15, wherein the one or more openings are separated from the liquid confinement structure.

17. The method of claim 10, wherein providing the gas to the region comprises providing the gas such that the gas substantially surrounds the localized liquid space and substantially separates the localized space from a different ambient gas atmosphere that surrounds the localized liquid space and comes into contact around the localized liquid space with the gas.

* * * * *